(12) United States Patent
Bruel

(10) Patent No.: US 8,324,530 B2
(45) Date of Patent: Dec. 4, 2012

(54) METHOD FOR HEATING A WAFER BY MEANS OF A LIGHT FLUX

(75) Inventor: Michel Bruel, Veurey Voroize (FR)

(73) Assignee: Soitec, Bernin (FR)

( * ) Notice: Subject to any disclaimer, the term of this patent is extended or adjusted under 35 U.S.C. 154(b) by 212 days.

(21) Appl. No.: 12/680,880

(22) PCT Filed: Sep. 26, 2008

(86) PCT No.: PCT/FR2008/051719
§ 371 (c)(1),
(2), (4) Date: Jun. 16, 2010

(87) PCT Pub. No.: WO2009/050381
PCT Pub. Date: Apr. 23, 2009

(65) Prior Publication Data
US 2010/0288741 A1  Nov. 18, 2010

(30) Foreign Application Priority Data
Oct. 1, 2007  (FR) ...................................... 07 57986

(51) Int. Cl.
*B23K 26/00* (2006.01)
(52) U.S. Cl. ......... 219/121.85; 219/121.76; 219/121.72; 219/121.6; 438/663; 438/487; 438/166; 438/795
(58) Field of Classification Search ............. 219/121.85, 219/121.76, 121.72, 121.6; 438/663, 487, 438/166, 795
See application file for complete search history.

(56) References Cited

U.S. PATENT DOCUMENTS

| 4,476,375 | A  | * | 10/1984 | Ogawa ..................... 219/121.72 |
| 6,110,813 | A  |   | 8/2000  | Ota et al. ....................... 438/597 |
| 6,573,161 | B1 |   | 6/2003  | Miyasaka et al. ............. 438/487 |
| 7,642,205 | B2 | * | 1/2010  | Timans ......................... 438/795 |
| 2003/0040130 | A1 | * | 2/2003 | Mayur et al. .................... 438/14 |

(Continued)

FOREIGN PATENT DOCUMENTS

EP          0 090 565          10/1983

(Continued)

OTHER PUBLICATIONS

International Search Report, PCT/FR2008/051719, mailed April 3, 2009.

(Continued)

*Primary Examiner* — Thinh T Nguyen
(74) *Attorney, Agent, or Firm* — Winston & Strawn LLP

(57) ABSTRACT

A method for heating a wafer that has at least one layer to be heated and a sub-layer. The method includes applying at least one light flux pulse to the wafer for heating the at least one layer in a manner such that the absorption coefficient of the flux by the layer is low as long as the temperature of the layer to be heated is in the low temperature range (PBT) but the absorption coefficient increases significantly when the temperature of the layer enters a high temperature range (PHT). Also, a sub-layer is selected such that the absorption coefficient of the applied light flux at the selected wavelength is high in the low temperature range (PBT) and the temperature enters the high temperature range (PHT) when the sub-layer is subjected to the light flux. The application of the light flux achieves improved heating of the wafer.

13 Claims, 5 Drawing Sheets

U.S. PATENT DOCUMENTS

| | | | |
|---|---|---|---|
| 2003/0160233 A1* | 8/2003 | Rendon et al. | 257/37 |
| 2006/0043367 A1 | 3/2006 | Chang et al. | 257/66 |
| 2007/0036994 A1 | 2/2007 | Andre et al. | 428/457 |

FOREIGN PATENT DOCUMENTS

| | | |
|---|---|---|
| EP | 1 083 590 | 3/2001 |
| FR | 2 859 820 | 3/2005 |
| JP | 61056409 | 3/1986 |
| WO | WO 01/80300 | 10/2001 |
| WO | WO 03/075329 | 9/2003 |

OTHER PUBLICATIONS

Galeckas A. et al., "Temperature Dependence of the Absorption Coefficient in 4H- and 6H-Silicon Carbide at 355 nm Laser Pumping Wavelength", Physica Status Solidi A, vol. 191, No. 2, pp. 613-620 (2002).

MacFarlane G. et al. "Fine Structure in the Absorption—Edge Spectrum of Si", Physical Review, vol. 111, No. 5, pp. 1245-1254 (1958).

* cited by examiner

METHOD FOR HEATING A WAFER BY MEANS OF A LIGHT FLUX

This application is a 371 filing of International Patent Application PCT/FR2008/051719 filed Sep. 26, 2008.

BACKGROUND

The present invention relates to the general technical field of material treatment, in particular in the field of thin layers, inserts, sheets or strips of material, especially semiconductors, and silicon in particular.

More specifically, the present invention relates to the field of the application of heat treatments to parts by means of light flux.

According to the state of the art, knowledge and methods exist that make use of light fluxes to carry out heat treatments, wherein light fluxes are absorbed on the outer surface and/or in the vicinity of the outer surface of the parts and the heating of the deeper portions takes place by thermal diffusion from the outer surface and/or the vicinity thereof receiving the light flux to the deeper zones of the part to be treated.

These prior art methods are characterised in that the light fluxes used are selected such that the material to be treated is naturally absorbent in terms of the light flux or rendered absorbent by the direct interaction of the light flux with the material of the part, for example using extremely high power levels.

The use of light fluxes proves to be particularly advantageous when it is desired to heat a superficial layer for very short times, in the region of a fraction of a microsecond to some tens of microseconds.

Nevertheless, since the heated thickness generally progresses according to the square root of the time from the outer surface of the part, it is extremely difficult and costly to heat the deep portions of the part and increasingly difficult and costly as the depths increase.

Furthermore, since the thermal profile obtained in the part generally displays a peak on the outer surface and declines in the material from said outer surface, it is necessary to limit the surface temperature to the maximum temperature not to be exceeded by the material within the scope of the method, for example the melting or vaporisation or decomposition point of the material. This limit involves moderate light power fluxes and long periods of time and thus high costs.

Moreover, the document WO 03/075329 proposes heating an absorbent sub-layer with a light flux via a front layer, the heat produced in the sub-layer heating the front layer by diffusion, at a temperature below that reached in the sub-layer.

The present invention relates to a method for heating, at least locally, a wafer comprising at least one layer to be heated and a sub-layer, at least locally, adjacent to said layer to be heated, under the effect of at least one light flux pulse.

The method according to the invention comprises the following steps:

selecting a light flux
wherein the wavelength is such that the absorption coefficient of said flux by the layer to be heated is low as long as the temperature of said layer to be heated is in the low temperature range and said absorption coefficient increases significantly when the temperature of the layer to be heated enters a high temperature range situated approximately above said low temperature range, and wherein the pulse intensity and duration are such that, in the absence of said sub-layer, the temperature of the layer to be heated remains within said low temperature range;

selecting a sub-layer
wherein the absorption coefficient of said light flux at said selected wavelength is high in said low temperature range
and wherein the temperature enters the high temperature range when said sub-layer is subject to the light flux;

and applying said light flux to said wafer, at least locally, via the face of said layer to be heated opposite said sub-layer.

According to the invention, the following mechanism takes place.

In a first phase, the light flux heats the sub-layer from the initial temperature thereof to a temperature at least situated in said high temperature range.

In a second phase, the sub-layer heats, by thermal diffusion, the adjacent portion of the layer to be heated to a temperature situated in said high temperature range.

In a third phase, this adjacent portion thus becoming absorbent and generating, in the layer to be heated, an absorbent thermal front wherein the temperature is situated in said high temperature range, said absorbent to thermal front progresses towards said front face under the combined or dual effect of forward thermal diffusion of the thermal front and a thermal energy supply by said light flux which reaches said thermal front via the not yet absorbent remainder of the layer to be heated.

According to the invention, said low temperature range and said high temperature range can be separated by a behaviour transition threshold of the absorption coefficient as a function of the temperature.

According to the invention, said behaviour transition threshold of the absorption coefficient as a function of the temperature may extend over a temperature range.

According to the invention, the layer to be heated may be low-doped silicon.

According to the invention, the layer to be heated may be a semiconductor material.

According to the invention, said low temperature range may correspond substantially to the range wherein the doping is not intrinsic and said high temperature range may correspond substantially to the range wherein the doping is intrinsic.

According to the invention, the layer to be heated may be gallium nitride.

According to the invention, the sub-layer may be amorphous silicon.

According to the invention, the sub-layer may be high-doped silicon.

According to the invention, the layer to be heated may be gallium nitride and the sub-layer is silicon.

According to the invention, the light flux may be generated by a laser.

The present invention will be understood more clearly on studying the heat treatment methods described as non-limitative examples illustrated by the figures wherein.

Figure 8:
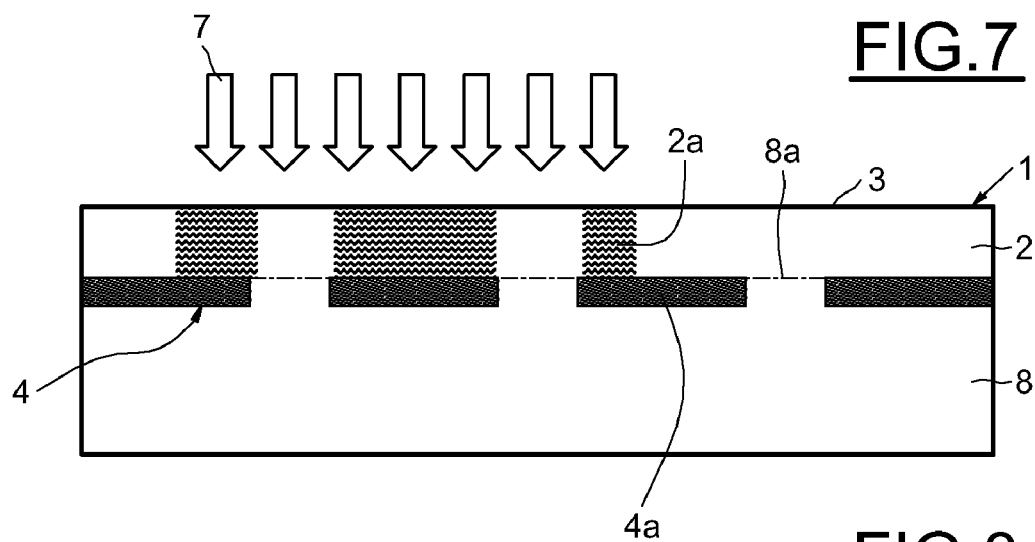
FIG. 8 represents a mechanism according to the invention applied to the wafer in FIG. 7.
Figure 9:
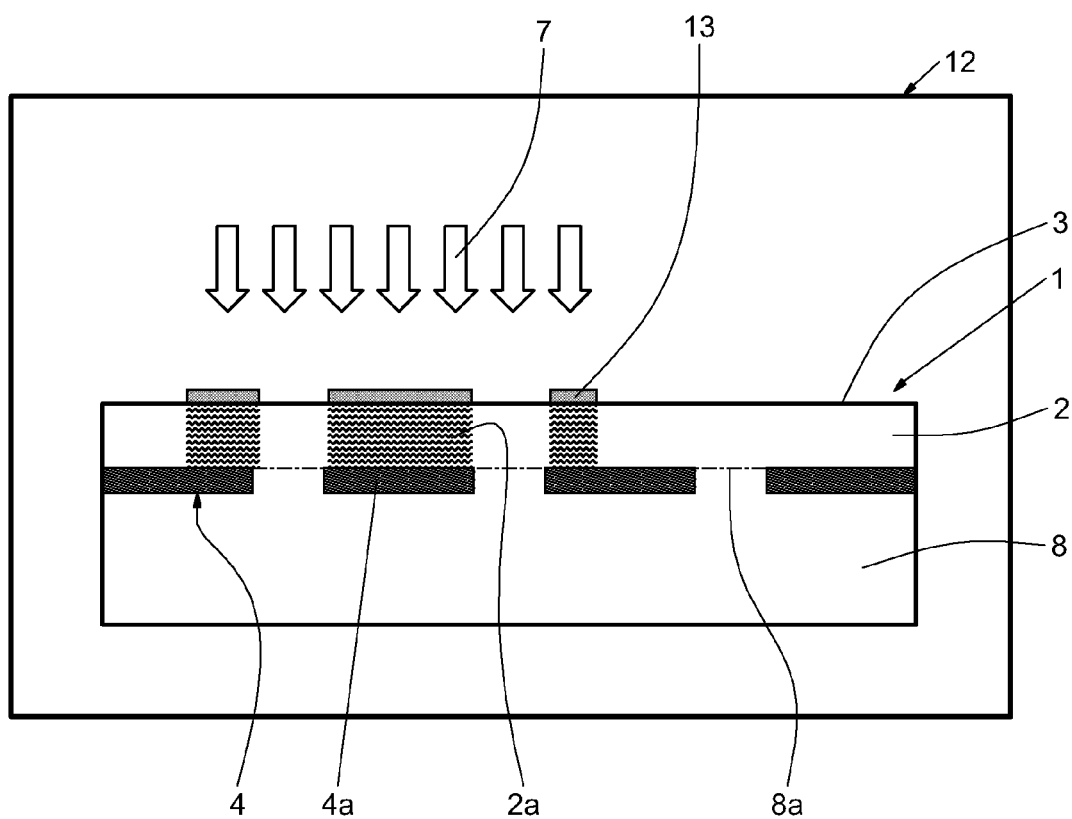

and FIG. 9 represents an example of use of the mechanism according to the invention, with reference to FIG. 8.

Figure 1:
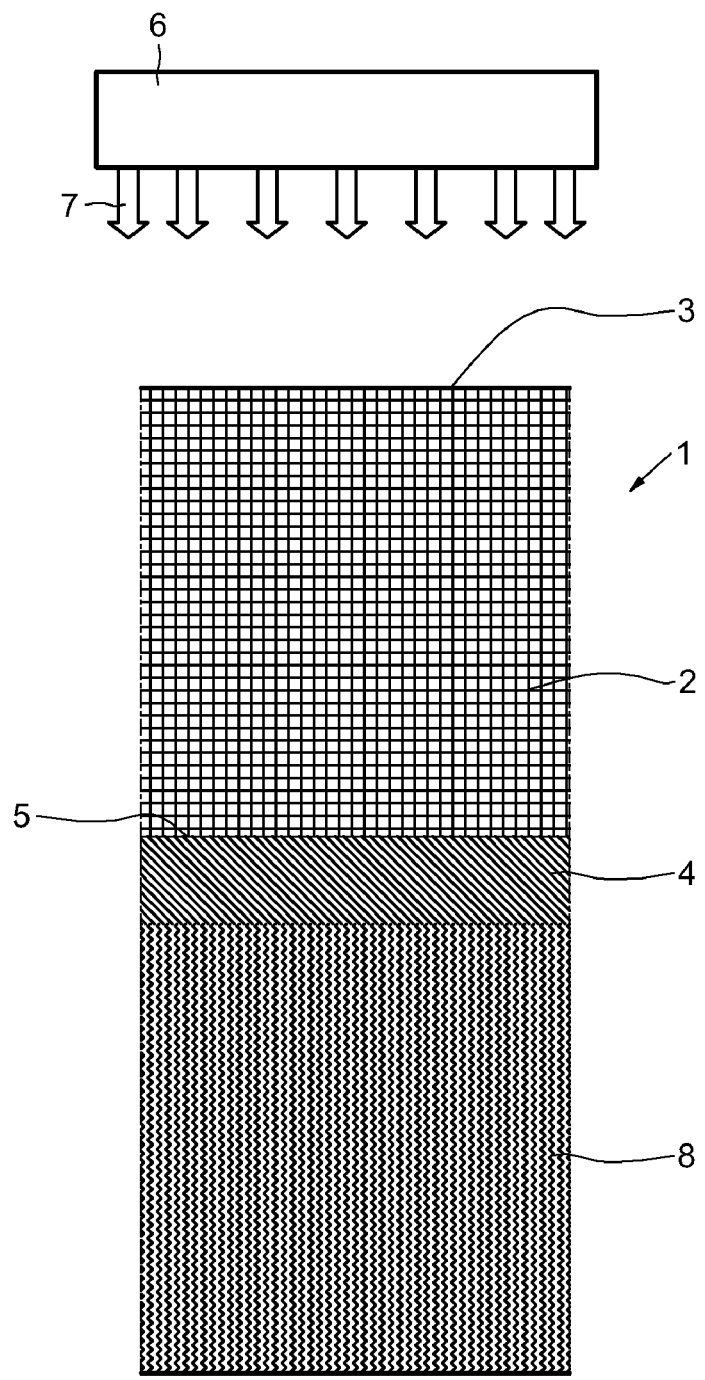
FIG. 1 represents a section of a wafer and an associated apparatus.

FIG. 1 represents a wafer 1 comprising a layer 2 having a front surface 3 and a sub-layer 4 adjacent to the rear surface 5 of the layer 2.

Opposite the front surface 5 of the layer 2, a light flux 7 pulse P generator 6 to said front surface 5 is installed.

In one alternative embodiment, the wafer 1 may comprise a rear layer 8 adjacent to the rear face of the sub-layer 4 to form a substrate.

The layer 2 and the light flux 7 are selected in relation to each other so as to have the following features.

The wavelength of the light flux 7 is such that the absorption coefficient of said flux by the layer 2 is low while the temperature T of said layer 2 is within a low temperature range PBT and the absorption coefficient increases significantly when the temperature T of the layer 2 enters a high temperature range PHT situated approximately above said low temperature range PBT.

The intensity and duration of the pulse supplied by the light flux 7 are such that, in the absence of the sub-layer 4, the temperature of the layer 2 remains within said low temperature range PBT.

The sub-layer 4 and the light flux 7 are selected in relation to each other so as to have the following features.

The absorption coefficient by the sub-layer 4 of the light flux 7 at said wavelength is high in said low temperature range PBT.

The temperature of the sub-layer 4, at least in the thickness thereof adjacent to the layer 2, enters the high temperature range PHT when said sub-layer 4 is subjected to said light flux 7.

Figure 2:
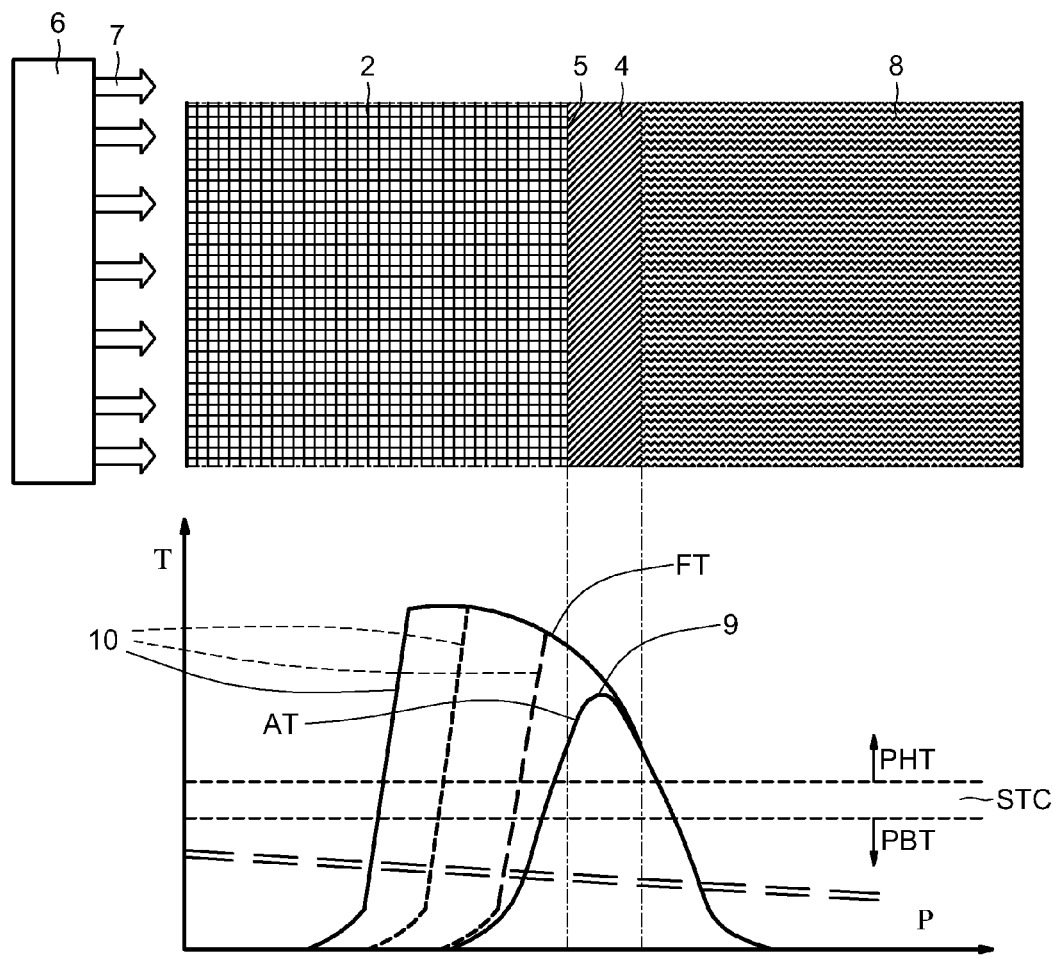
FIG. 2 represents a mechanism according to the invention applied to the wafer in FIG. 1, with depth on the X-axis and the temperature on the Y-axis.

With the wafer 1 at an initial temperature situated in the low temperature range PBT, the light flux 7 is applied to the wafer 1 via the front face 3 thereof. The following temperature rises as represented in FIG. 2 then take place.

In the example shown, the upper limit LST of the low temperature range PBT is considered to be less than the lower limit LIT of the upper temperature range PHT. The low temperature range PBT and the high temperature range PHT are separated by a behaviour transition threshold STC of the absorption coefficient as a function of the temperature extending over a transition temperature range.

The mechanism is as follows.

In a first phase, the light flux 7 passes through the layer 2 without the temperature reaching the high temperature range PHT and, reaching the sub-layer 4 in depth, heat said sub-layer 4 from the initial temperature thereof to a temperature at least situated in the high temperature range PHT. The temperature curve 9 is obtained.

In a second phase, the sub-layer 4 forms a transitory heat source and heats, by thermal diffusion, the adjacent portion of the layer 2 to a temperature AT situated in the high temperature range PHT.

In a third phase, this adjacent portion thus becomes absorbent and generates, in depth in the layer 2 to be heated, an absorbent thermal front 10 wherein the temperature FT is situated in the high temperature range PHT, preferably situated above the temperature AT. This absorbent thermal front 10, generated in depth, progresses towards the front face 3 under the combined effect of forward thermal diffusion of the front 10 and a heat energy supply by the light flux 7 which reaches this thermal front 10 via the not yet absorbent remainder of the layer to be heated 2.

When the flux 7 is stopped, the progression of the thermal front 10, according to said propagation mode, stops almost immediately in the layer 2 if it has not reached the front face 3. The progression of the thermal front 10 is thus governed solely by the effects of thermal diffusion.

Under specific constant light flux 7 conditions, the heating of the layer 2 takes place over a thickness substantially in a linear relationship with the duration of the heat flux.

The above sequencing of the above three phases means that they take place in succession over time. However, the description of this succession does not rule out a partial overlap of these phases over time.

EXAMPLES OF EMBODIMENTS

The light flux 7 may be a CO2 laser pulse lasting 6 microseconds with a flux of $3.75*1.E6$ W/cm2.

The transparent material forming the layer 2 may be silicon doped to a level in the region of $1.E15/cm3$ and initially placed at ambient temperature.

Under these conditions, the absorption of the silicon is in the region of a few cm−1, which is low and remains substantially constant once the temperature of the silicon does not reach approximately 270° C. From approximately this temperature, the intrinsic carrier concentration becomes greater than $1*E15$ cm−2 (See the document entitled "Physics of Semiconductor Devices", second Edition, ISBN 0-07-062735-5, by S. M. SZE, John Wiley and Sons, page 20—FIG. 12 and page 26—FIG. 16).

The low temperature range PBT is thus the temperature range situated substantially below the lower temperature limit LIT equal to approximately 270° C., whereas the high temperature range PHT is the range substantially situated above 270° C. In accordance with the above document, the low temperature range PBT is situated in the non-intrinsic saturation and/or gel range of the carriers and the high temperature range PHT is situated in the intrinsic range.

The absorbent material forming the sub-layer 4 may be silicon doped at a level in the region of $1.E19/cm3$ and initially placed at ambient temperature, giving same an absorption coefficient of several hundred cm−1.

The thickness of the layer 2 may be approximately 90 μm and the thickness of the sub-layer 4 may be approximately 10 μm.

The sub-layer 4 may be created by means of epitaxy or deposition or ion implantation.

According to a first example for obtaining the wafer 1, a silicon substrate doped to $1*E15$ cm−3 and having a thickness equal to 100 μm is produced by thinning a standard silicon slice. Through one of the faces, boron ion implantation is performed at a dose of some $1*E16/cm2$ and annealing is performed at a temperature of approximately 1000° C. to 1100° C. for two hours so as to attain a doping depth of approximately 10 microns to obtain the sub-layer 4, the remaining thickness of 90 μm forming the layer 2. The face not used for implantation thus forms the face 3 through which the light flux 7 is to be applied.

According to a second example for obtaining the wafer 1, on a standard silicon substrate, epitaxy of silicon doped with antimony to $1*E19/cm3$ and having a thickness of 10 microns is performed to form the sub-layer 4. Then, on top of the 10 micron epitaxy, epitaxy of silicon doped to $1*E15/cm3$ and having a thickness of 90 microns is performed to form the layer 2.

As additional examples, the absorbent material of the sub-layer 4 could also be, if a CO2 laser is used, an amorphous silicon layer, a completely or partially amorphised layer by ion implantation or a layer of silicon oxide SiO2.

If a part is envisaged to consist solely of the layer 2, without the sub-layer 4, and the light flux defined above is applied, it can be observed that the temperature of the material increases by less than 30° C. This result is obtained from a simulation by resolving the heat equation using a so-called finite difference method, which belongs to the prior art.

This result could also have been obtained by applying the following simple formula:

identification of the maximum value Alphamax of the absorption coefficient on the low temperature range PBT the order of magnitude of the maximum temperature reached Tmax is then given by Tmax=Phi*tau*alphamax/Cp where Cp is the heat capacity, Phi is the flux, Tau is the flux duration, Cp the volumetric heat, and where Phi is equal to 3.75*1.E6 W/cm2, tau—equal to 6*1.E-6 S–alphamax—equal to 2 cm–1–Cp—equal to 1.4 J/cm3.

The order of magnitude of the maximum temperature Tmax reached by the single layer 2 is thus found to be equal to 32° C.

It is noted that, under these conditions, the temperature of the layer 2 remains very low and within the low temperature range PBT.

However, in the presence of the sub-layer 4, it is possible to heat a large thickness of transparent material up to temperatures in the region of 1650 K on thicknesses in the region of 60 μm. This result is obtained from a simulation by resolving the heat equation using a so-called finite difference method, which belongs to the prior art.

EXAMPLES OF APPLICATION

Example 1

Figure 3:
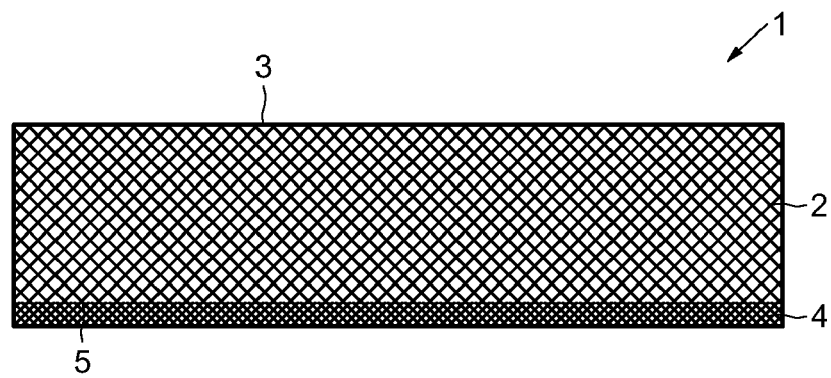
FIG. 3 represents a section of a further wafer.

As shown in FIG. 3, starting with a non-doped and disoriented grain polycrystalline silicon substrate, one of the faces is oxidised using conventional techniques used in microelectronics and a wafer 1 is obtained, comprising a non-doped and disoriented grain monocrystalline silicon layer 2 and a silicon oxide sub-layer 4.

In this way, at ambient temperature, this layer 2 is substantially transparent to the light flux generated by a CO2 laser and the sub-layer 4 is absorbent for such a light flux.

Figure 4:
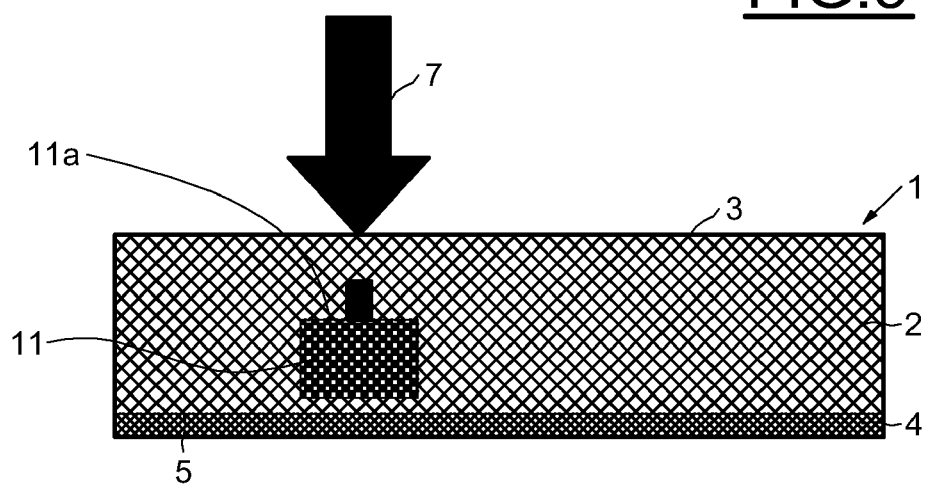
FIGS. 4 and 5 represent a mechanism according to the invention applied to the wafer in FIG. 3.

Then, as shown in FIG. 4, an irradiation of such a light flux, in pulse form, is applied via the front face 3 of the layer 2, for example locally on one or a plurality of zones.

This application produces, under the effect of the prior heating of the sub-layer 4 and according to the mechanism as described above, liquefaction by heating the layer 2 on a zone 11 corresponding approximately to the light flux application zone, said liquefied zone 11 starting on the rear face 5 of the layer 2 or in the immediate vicinity of said rear face 5 and wherein the thermal front 11a progresses forwards to reach the front face 3, for example.

Figure 5:
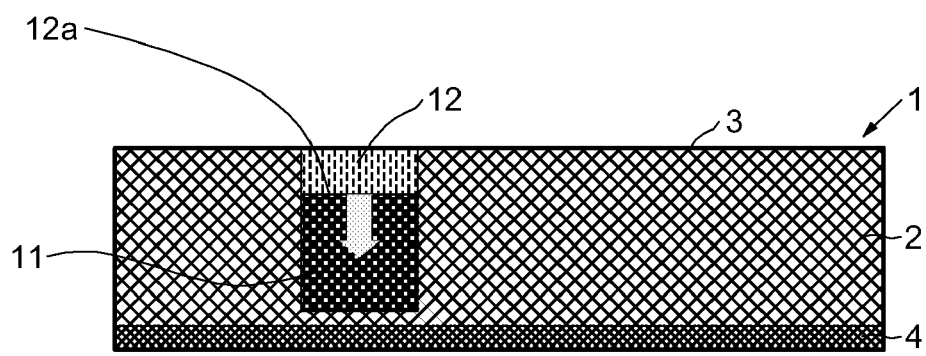

As shown in FIG. 5, after the end of the application of the light flux, a cooling front 12a of the zone 11 occurs from the front face 3. This front 12a progresses to the rear to the rear face 5 to form a zone 12 wherein the silicon is re-solidified by recrystallising into polycrystalline silicon. Due to the temperature gradients, recrystallisation generates potentially larger grains, oriented substantially perpendicular to the thickness of the layer 2.

The entire layer 2 may be treated by scavenging.

Such a zone may display superior electrical properties and may be advantageous for the creation of photovoltaic cells.

Example 2

Figure 6:
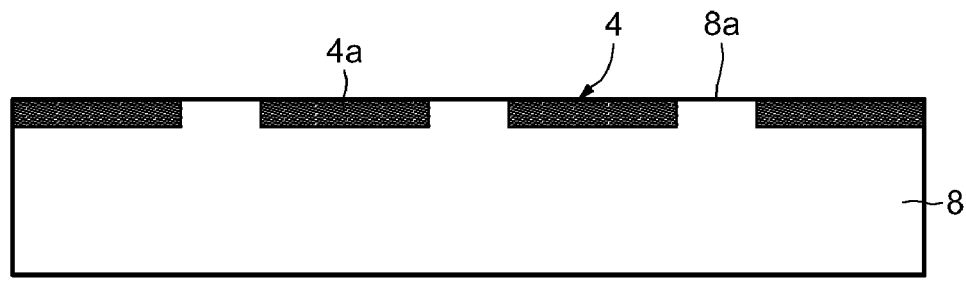
FIGS. 6 and 7 represent an embodiment of a further wafer represented in a sectional view.

As shown in FIG. 6, starting with a non-doped monocrystalline silicon substrate, forming a backing 8, local zones 4a are created by means of surface doping of a face 8a of said substrate with approximately 1E20/cm–3 of type n using conventional techniques used in microelectronics, so as to obtain an absorbent sub-layer 4 consisting of said local zones 4a. For example, each zone 4a is square and has a thickness of approximately 2 microns and sides equal to approximately 50 microns, the spacing between the zones 4a being approximately 25 microns.

Figure 7:
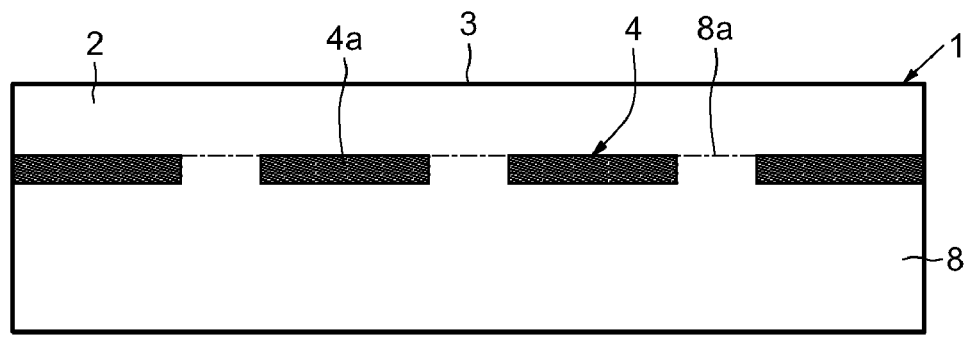

Then, as shown in FIG. 7, epitaxy of non-doped silicon is performed on the face 8a so as to form a layer 2.

Then, as shown in FIG. 8, on the front face 3, an infrared power light beam or flux 7 (for example an ytterbium doped fibre power laser) is applied, depositing 20 Joules/cm2 of surface area in a few hundred nanoseconds. This causes, as described above, at least local heating of the zones 2a of the layer 2 situated between the zones 4a of the sub-layer 4 and the front face 3, without heating the other parts of the layer 2. This differential heating may then be used to treat the heated zones 2a.

For example, as shown in FIG. 9, it is possible to perform the heating obtained above with reference to FIG. 8 in a chamber 12 containing oxygen and/or water vapour. The presence of oxygen and the temperature rise located in the zones 2a of the layer 2 result in the creation of silicon oxide zones 13 on the front face 3 of the layer 2, self-aligned on top of the deep zones 4a.

What is claimed is:

1. A method for heating a wafer by at least one light flux pulse, wherein the wafer has at least one layer to be heated and a sub-layer adjacent the layer to be heated, which comprises:

selecting a light flux having a wavelength such that the absorption coefficient of the light flux by the layer to be heated is low as long as the temperature of the layer to be heated is in a low temperature range (PBT) but wherein the absorption coefficient increases significantly when the temperature of the layer to be heated enters a high temperature range (PHT) situated approximately above the low temperature range, wherein pulse intensity and duration are such that, in the absence of the sub-layer, the temperature of the layer to be heated remains within the low temperature range;

selecting a sub-layer having an absorption coefficient of the light flux at the selected wavelength which is high in the low temperature range (PBT), wherein the temperature of the sub-layer enters the high temperature range (PHT) when the sub-layer is subject to the light flux; and applying the light flux to the wafer, at least locally, via the front face of the layer to be heated opposite the sub-layer, for a sufficient time to heat, in a first phase, the sub-layer from its initial temperature to a temperature at least situated in the temperature range (PHT), and, in a second phase, to heat, by thermal diffusion from the heated sub-layer, an adjacent portion of the layer to be heated to a temperature situated in the high temperature range (PHT), and further, in a third phase, to render absorbent the adjacent portion, thus generating, in the layer to be heated, an absorbent thermal front wherein the temperature is situated in the high temperature range (PHT), with the absorbent thermal front progressing towards the front face under the combined or dual effect of forward thermal diffusion of the thermal front and thermal energy supplied by the light flux which reaches the thermal front via the not yet absorbent remainder of the layer to be heated.

2. The method according to claim 1, wherein the low temperature range (PBT) and high temperature range (PHT) can be separated by a behavior transition threshold of the absorption coefficient as a function of the temperature.

3. The method according to claim 2, wherein the behavior transition threshold (STC) of the absorption coefficient as a function of the temperature extends over a temperature range.

4. The method according to claim 1, wherein the layer to be heated is a low-doped silicon.

5. The method according to claim 1, wherein the layer to be heated is a semiconductor material.

6. The method according to claim 5, wherein the low temperature range (PBT) corresponds substantially to the range wherein the doping is not intrinsic and said high temperature range (PHT) corresponds substantially to the range wherein the doping is intrinsic.

7. The method according to claim 1, wherein the layer to be heated is gallium nitride.

8. The method according to claim 1, wherein the sub-layer is amorphous silicon.

9. The method according to claim 1, wherein the sub-layer is a high-doped silicon.

10. The method according to claim 1, wherein the layer to be heated is gallium nitride and the sub-layer is silicon.

11. The method according to claim 1, wherein the light flux is generated by a laser.

12. A method for heating a wafer by at least one light flux pulse, which comprises:
configuring the wafer to have (a) at least one layer to be heated, the layer having an absorption coefficient of the light flux which is low as long as the temperature of the layer to be heated is in a low temperature range (PBT), and (b) a sub-layer having an absorption coefficient of the light flux at the selected wavelength which is high in the low temperature range (PBT);
applying the light flux to the wafer via the front face of the layer to be heated opposite the sub-layer for a sufficient time, to obtain:
heating of the sub-layer from its initial temperature to a temperature at least situated in a high temperature range (PHT),
subsequent heating, by thermal diffusion from the sub-layer, of an adjacent portion of the layer to be heated to a temperature situated in the high temperature range (PHT),
providing in the adjacent portion of the layer to be heated an absorbent thermal front wherein the temperature is situated in the high temperature range (PHT), and
advancing the absorbent thermal front towards the front face under the combined or dual effect of forward thermal diffusion of the thermal front and thermal energy supplied by the light flux which reaches the thermal front via the not yet absorbent remainder of the layer to be heated.

13. In a wafer that is to be heated by at least one light flux pulse, wherein the wafer has at least one layer to be heated and a sub-layer adjacent the layer to be heated, wherein the at least one layer to be heated has an absorption coefficient of the light flux which is low as long as the temperature of the layer to be heated is in a low temperature range (PBT), and the sub-layer having an absorption coefficient of the light flux at a selected wavelength which is high in the low temperature range (PBT), the improvement which comprises:
applying the light flux to the wafer, at least locally, via the front face of the layer to be heated opposite the sub-layer for a sufficient time, to obtain:
heating of the sub-layer from its initial temperature to a temperature at least situated in a high temperature range (PHT),
subsequent heating, by thermal diffusion from the sub-layer, of an adjacent portion of the layer to be heated to a temperature situated in the high temperature range (PHT),
providing in the adjacent portion of the layer to be heated an absorbent thermal front wherein the temperature is situated in the high temperature range (PHT), and
advancing the absorbent thermal front towards the front face under the combined or dual effect of forward thermal diffusion of the thermal front and thermal energy supplied by the light flux which reaches the thermal front via the not yet absorbent remainder of the layer to be heated.

\* \* \* \* \*

UNITED STATES PATENT AND TRADEMARK OFFICE
CERTIFICATE OF CORRECTION

| | | |
|---|---|---|
| PATENT NO. | : 8,324,530 B2 | Page 1 of 1 |
| APPLICATION NO. | : 12/680880 | |
| DATED | : December 4, 2012 | |
| INVENTOR(S) | : Bruel | |

It is certified that error appears in the above-identified patent and that said Letters Patent is hereby corrected as shown below:

Column 1:
Between lines 52-53, insert the heading
-- SUMMARY OF THE INVENTION --.

Column 2:
Between lines 56-57, insert the heading
-- BRIEF DESCRIPTION OF THE DRAWINGS --.

Column 3:
Between lines 6-7, insert the head
-- DETAILED DESCRIPTION OF THE INVENTION --.

Signed and Sealed this
Twelfth Day of February, 2013

Teresa Stanek Rea
*Acting Director of the United States Patent and Trademark Office*